(12) United States Patent
Nagaishi et al.

(10) Patent No.: US 6,388,440 B1
(45) Date of Patent: May 14, 2002

(54) MAGNETIC FIELD BIAS ADJUSTING DEVICE FOR SQUID MODULATION DRIVE CIRCUIT ACHIEVING EASY ADJUSTMENT

(75) Inventors: Tatsuoki Nagaishi; Tetsuya Hirano; Hideo Itozaki, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/548,737

(22) Filed: Apr. 13, 2000

(30) Foreign Application Priority Data

May 13, 1999 (JP) .......................................... 11-132086

(51) Int. Cl.$^7$ .......................................... G01R 33/035
(52) U.S. Cl. ...................................... 324/248; 505/846
(58) Field of Search .......................... 324/248; 505/162, 505/845, 846; 327/527

(56) References Cited

U.S. PATENT DOCUMENTS 5,291,135 A   3/1994   Hotta et al. .................. 324/248

FOREIGN PATENT DOCUMENTS

| EP | 0 499 968 | 8/1992 |
|----|-----------|--------|
| EP | 0 837 337 | 4/1998 |
| JP | 03-131781 | 6/1991 |
| JP | 04-340488 | 11/1992 |

Primary Examiner—Walter E. Snow
(74) Attorney, Agent, or Firm—Foley & Lardner

(57) ABSTRACT

A modulation current at a predetermined frequency f is applied from an AC source to a flux locked loop for maintaining magnetic flux supplied to a SQUID at a constant value. An output voltage is picked out from the SQUID in this state to which a predetermined bias current is being applied from a current and field bias application circuit, and the picked out voltage passed through a filter and a rectifier is monitored by a voltage monitor. The filter picks out a frequency component of 80 kHz which is twice as high as the frequency component f, 40 kHz, applied from the AC source, and maximizes it. In this way, a method and a device for easily adjusting magnetic field bias in a modulation drive circuit for a SQUID can be provided.

12 Claims, 10 Drawing Sheets

MODULATION FIELD IN φo/2

(DC CURRENT BIAS)

(AC CURRENT BIAS)

+Ib APPLIED    −Ib APPLIED

80kHz

MAGNETIC FIELD BIAS ADJUSTING DEVICE FOR SQUID MODULATION DRIVE CIRCUIT ACHIEVING EASY ADJUSTMENT

BACKGROUND OF THE INVENTION

1. Field of the Invention

The present invention relates to a method and a device for adjusting magnetic field bias in a modulation drive circuit for a superconducting quantum interference device (hereinafter referred to as SQUID). In particular, the invention relates to a method and a device for easily adjusting magnetic field bias in a SQUID modulation drive circuit.

2. Description of the Background Art

FIG. 15 is a circuit diagram showing a conventional control circuit for a SQUID with a flux locked loop (hereinafter referred to as FLL). Referring to FIG. 15, the conventional SQUID FLL circuit includes a SQUID 81 having two Josephson junctions formed at predetermined positions and a constant current source 88 supplying constant current to SQUID 81. Magnetic flux to be measured is input from a pickup coil (not shown) to SQUID 81. Voltage output through both ends of SQUID 81 is converted by a transformer, amplified by a preamplifier 83 and then output from an output portion through a multiplier 84 and an integrator 85. A modulation signal at 40 kHz is added by a modulating unit 87 to the output from multiplier 84 for feedback to a field application coil 82 adjacent to SQUID 81. Accordingly, external magnetic flux detected at SQUID 81 is cancelled.

The output from SQUID 81 is also fed to an oscilloscope 90 provided separately from the output portion for observing the waveform thereof. Specifically, a feedback signal is partially input to the X axis of oscilloscope 90 and an output from preamplifier 83 is input to the Y axis of oscilloscope 90.

As a method of reducing low frequency noise, an AC biasing method is known. According to the AC biasing method, positive and negative currents having the same absolute value (the absolute value is equal to that of the constant current) are applied to a SQUID. In order to achieve a stable feedback, both outputs from the SQUID to which the positive and negative current biases are being applied should be in phase with each other. In order to achieve this, magnetic field bias is adjusted to match the phases with each other.

The magnetic field bias has conventionally been adjusted by manually adjusting the phase of voltage waveform on oscilloscope 90 while observing change of voltage relative to the magnetic field, with respect to time. This method has a problem that adjustment of the magnetic field bias is extremely complicated and time-consuming.

SUMMARY OF THE INVENTION

One object of the present invention is accordingly to provide a method of easily adjusting magnetic field bias in a modulation drive circuit for a SQUID.

Another object of the present invention is to provide a device for easily adjusting magnetic field bias in a modulation drive circuit for a SQUID.

The objects above are accomplished by a method of adjusting magnetic field bias in a SQUID modulation drive circuit that includes following steps. Specifically, according to one aspect of the present invention, a method of adjusting magnetic field bias in a SQUID modulation drive circuit includes the steps of applying a modulation signal at a predetermined first frequency to a flux locked loop maintaining magnetic flux supplied to the SQUID at a constant value, picking out an output voltage from the SQUID to which a predetermined bias current is being applied, and picking out the output voltage such that a frequency component of the voltage which is twice as high as the first frequency is a maximum frequency.

The output voltage is picked out from the SQUID to which a predetermined modulation frequency is being applied and then the frequency component of the output voltage twice the frequency of the applied predetermined modulation frequency is maximized, so that the magnetic field bias can be optimized easily.

Preferably, the step of applying to the flux locked loop the modulation signal at the predetermined first frequency includes the step of applying the modulation signal at the predetermined first frequency to a coil adjacent to the SQUID, and the magnetic field bias is thus adjusted by applying magnetic field bias to the coil adjacent to the SQUID.

A method of adjusting magnetic field bias can thus be provided with a simple structure since the magnetic field bias is adjusted by applying magnetic field bias to a coil adjacent to the SQUID, to which a modulation signal at a predetermined frequency is applied.

The magnetic field bias may be adjusted manually. A low cost method of adjusting magnetic field bias can accordingly be provided.

The magnetic field bias may be adjusted automatically. A labor-saving method of adjusting magnetic field bias can accordingly be provided.

The bias current may be alternating current or direct current.

According to another aspect of the invention, a device for adjusting magnetic field bias in a SQUID modulation drive circuit includes a unit for applying a modulation signal at a predetermined first frequency to a flux locked loop maintaining magnetic flux supplied to the SQUID at a constant value, a unit for picking out an output voltage from the SQUID to which a predetermined bias current is being applied, and a filter for picking out the output voltage such that a frequency component of the voltage which is twice as high as the first frequency is a maximum frequency.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 illustrates change in voltage relative to time with feedback ON.

DESCRIPTION OF THE PREFERRED EMBODIMENTS

Embodiments of the present invention will be described below in conjunction with the drawings.

Figure 1:
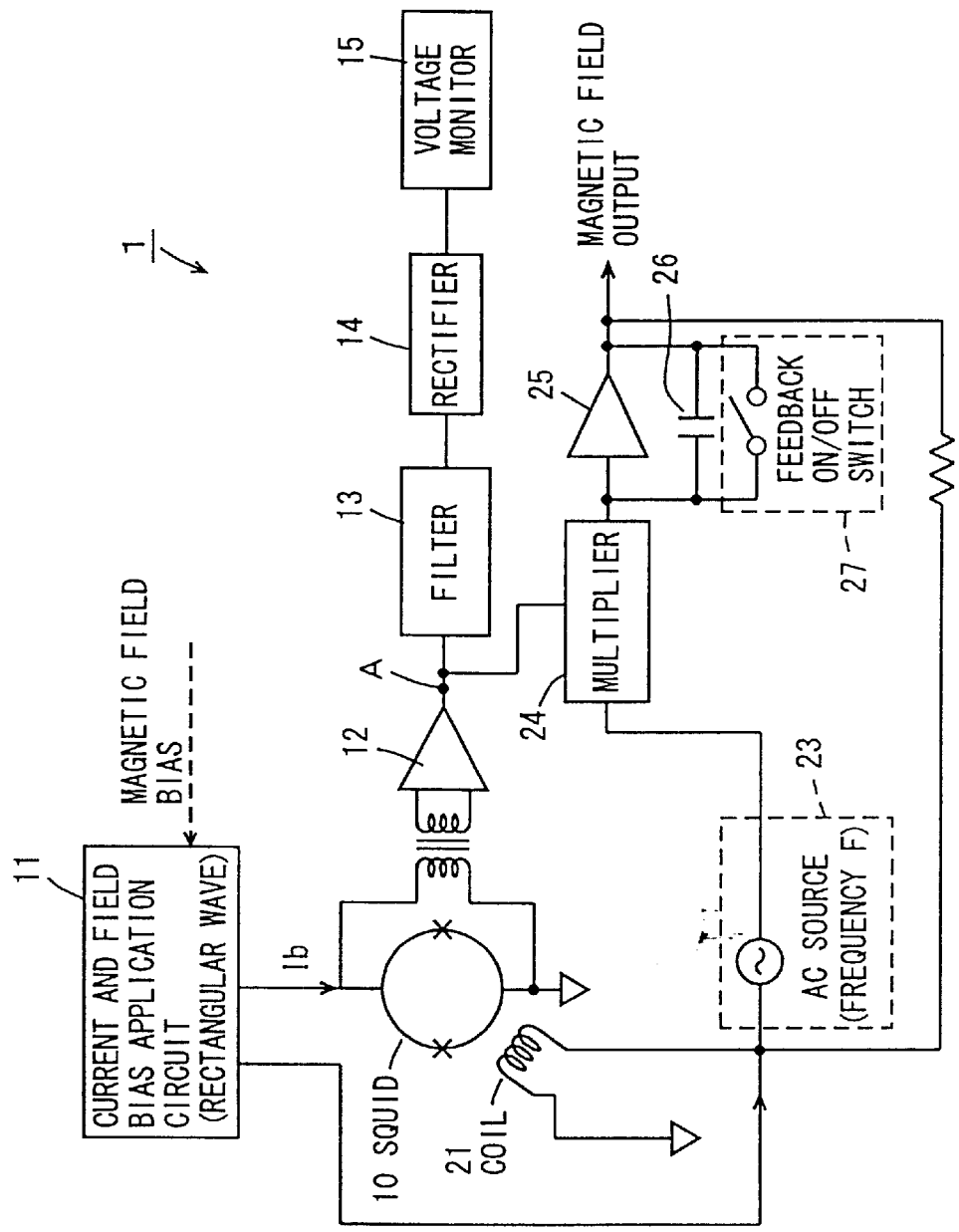
FIG. 1 is a block diagram showing an entire structure of a SQUID modulation drive circuit.

Referring to FIG. 1, a SQUID magnetic flux detection device 1 includes a SQUID 10, a current and magnetic field bias application circuit 11 which applies a predetermined bias current to SQUID 10, a voltage amplifier 12 which amplifies output voltage through both ends of SQUID 10, a filter 13 which passes among components of the voltage amplified by voltage amplifier 12 only a frequency component $2f$ twice a predetermined frequency f, the frequency component $2f$ being a modulation signal component described later, a rectifier 14 which rectifies only the frequency component $2f$ passed through filter 13, and a voltage monitor 15 for monitoring the rectified voltage.

The voltage amplified by voltage amplifier 12 is fed to a multiplier 24 which supplies a feedback signal for compensating for change of magnetic flux input to SQUID 10 and then to an integrator 25 which determines the integral of the output voltage from multiplier 24, and integrator 25 supplies an output as a measured magnetic field output. The output signal from integrator 25 is supplied as a feedback to a coil 21 adjacent to SQUID 10. An AC field at frequency f applied from an AC source 23, a field bias with a rectangular wave from current and field bias application circuit 11, and a feedback field from integrator 25 are superimposed on coil 21. A capacitor 26 and a feedback ON/OFF switch 27 are provided in parallel with integrator 25.

First Embodiment

Adjustment in the circuit shown in FIG. 1 is described now. A magnetic field bias signal represented by the dotted line shown in FIG. 1 is to be adjusted. In the first embodiment, the adjustment is manually made with observation of voltage monitor 15.

Figure 2A:
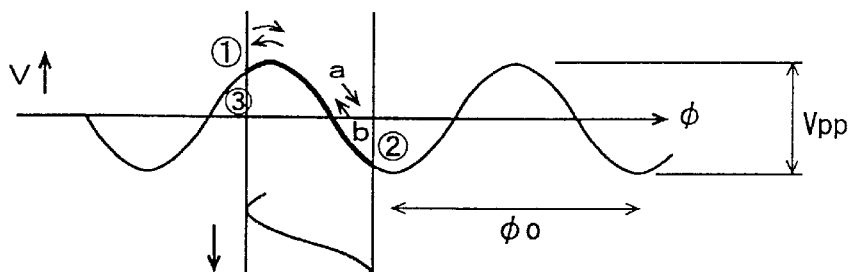
FIGS. 2A to 2C illustrate a magnetic field—voltage characteristic in the SQUID.
Figure 2B:
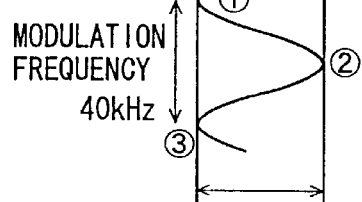

Specific description is now given. FIG. 2A is a graph illustrating a relation between magnetic field and output voltage from SQUID 10, the signal waveform taken at the portion indicated by A in FIG. 1. FIG. 2B illustrates change of the signal waveform with respect to time, the waveform corresponding to a half period of the signal waveform in FIG. 2A. The period of the magnetic field is $\Phi_0$ in FIG. 2A. The amplitude of the voltage resulting from this magnetic field is represented by Vpp. This value changes with application of a bias current Ib from current and field bias application circuit 11, attaining the maximum at a certain optimum value.

Referring to FIG. 2A, an arbitrary section corresponding to a half period shown as a bold line is picked out from the waveform. The arbitrary section of the waveform corresponding to the half period which changes with time as shown in FIG. 2B. The waveform section varies at a modulation frequency f, 40 kHz, applied by AC source 23. In FIG. 2A, the voltage changes in half the period $\Phi_0$, from the point indicated by ① to the point (②) along the arrow indicated by a, and to the point ③ along the arrow indicated by b. The change from ① to ③ corresponds to the portion represented by the same indications ① to ③ on the modulation frequency in FIG. 2B. In other words, FIG. 2B shows change of the magnetic field in half the period $\Phi_0$ with respect to time.

Figure 2C:
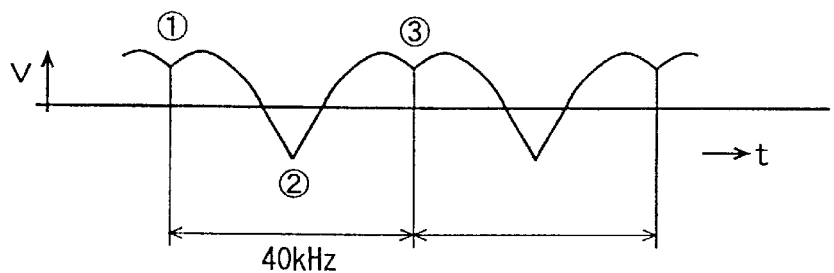

FIG. 2C shows change of voltage V with time, relative to modulation field in half the period shown in FIG. 2B. The indications ① to ③ in FIG. 2C also correspond to those in FIGS. 2A and 2B.

Figure 3A:
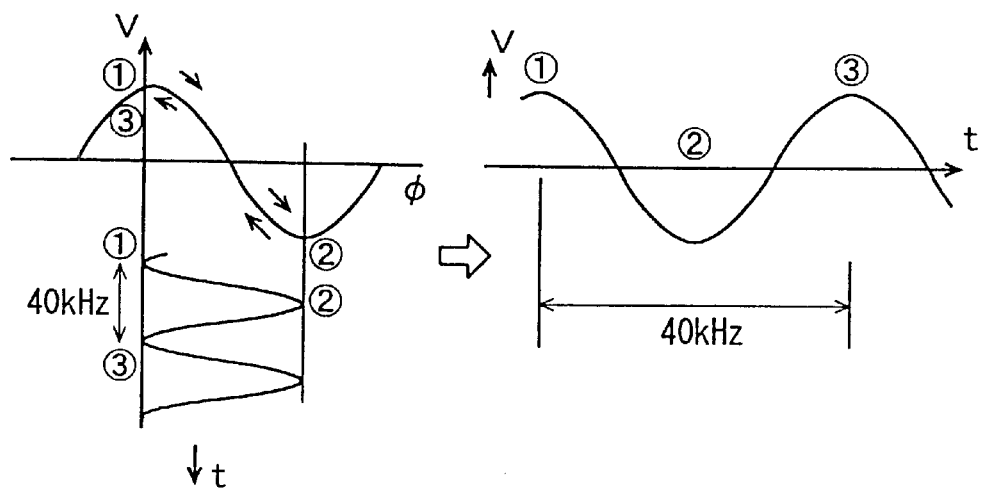
FIGS. 3A and 3B illustrate a magnetic field—voltage characteristic.

FIG. 3A corresponds to FIGS. 2A and 2B, showing a magnetic field—voltage characteristic in the half period, the voltage picked out such that the voltage changes between the maximum and minimum values. When the half period is selected as shown in FIG. 3A in which the voltage changes between the maximum and minimum values, the change of voltage with respect to time coincides with 40 kHz.

Figure 3B:
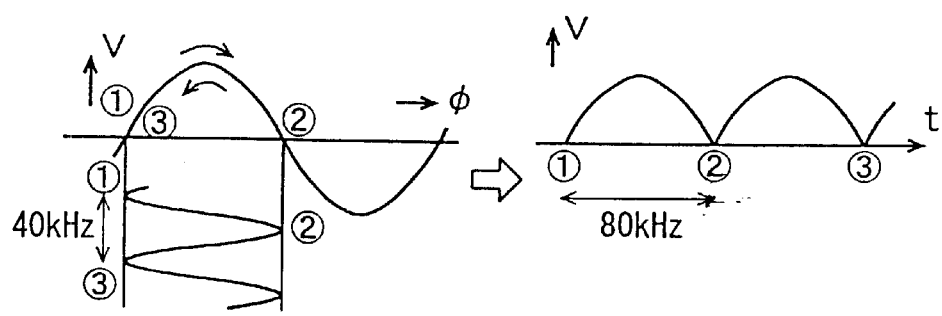

FIG. 3B corresponds to FIGS. 2A and 2B, showing a magnetic field—voltage characteristic in the half period, the voltage picked out having the minimum amplitude. When the voltage in this state changing with time is picked out, as shown in FIG. 3B, the signal frequency is 80 kHz, which is twice as high as the modulation frequency.

The state shown in FIG. 2A is accordingly the intermediate between respective states shown in FIGS. 3A and 3B. Therefore, the voltage signal varying with time relative to the modulation field has both of the modulation frequency 40 kHz and twice that frequency, 80 kHz, in the state of FIG. 2A.

Accordingly, the output voltage of SQUID 10 has a frequency component equal to that of the modulation field and/or a frequency component twice that of the modulation field, and the maximum value of the output Vpp of SQUID 10 is obtained when the sum of the modulation field frequency component and the component twice the modulation field frequency component of the output voltage attains the maximum, i.e. when an optimum bias current value Ib is obtained.

Optimization of magnetic field bias $\Phi b$ is required when AC bias Ib is applied. Optimization of magnetic field bias $\Phi b$ enables reduction of low frequency noise if DC bias is applied.

Figure 4:
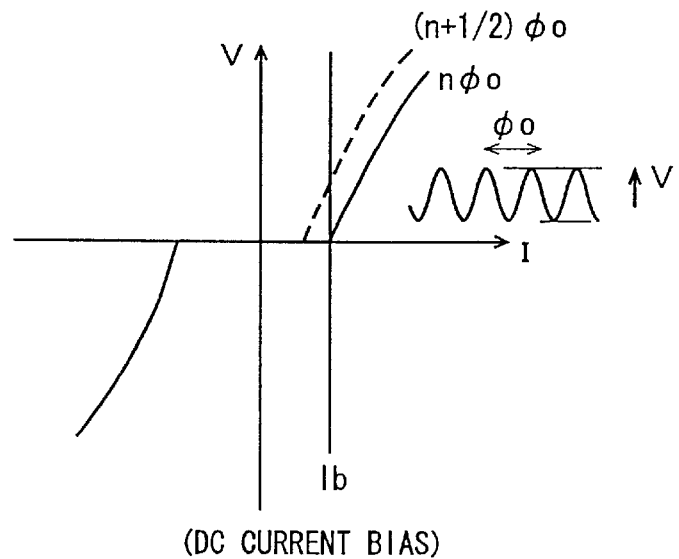
FIG. 4 illustrates a current—voltage characteristic in the SQUID.

FIG. 4 shows a current—voltage characteristic of SQUID 10 to which DC bias is applied. The optimum bias current value is represented by Ib, which is obtained when the magnetic field applied to SQUID 10 is n times as high as $\Phi_0$.

Figure 5:
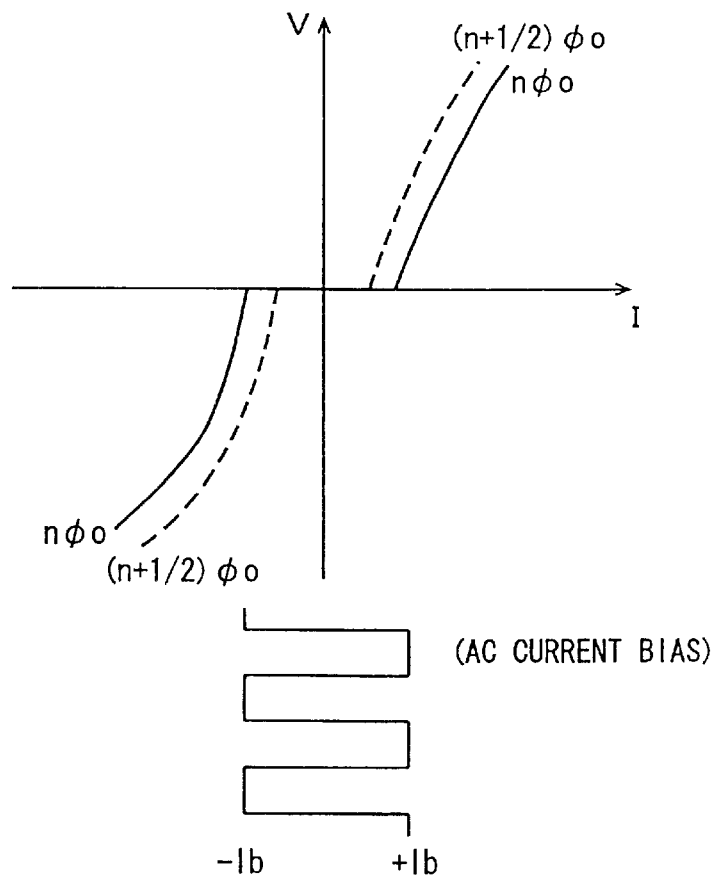
FIG. 5 illustrates a current—voltage characteristic in the SQUID to which AC bias is applied.

FIG. 5 shows a current—voltage characteristic when AC bias is applied. In this case, current bias +Ib and −Ib are set on the +and −sides.

Figure 6A:
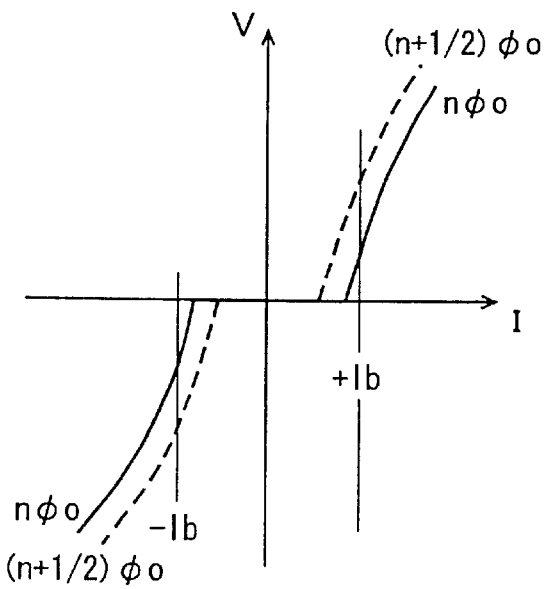
FIGS. 6A to 6C illustrate a current—voltage characteristic when AC bias is applied.
Figure 6B:
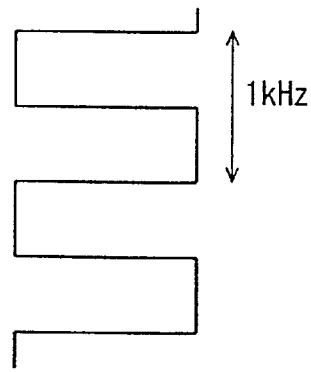

FIG. 6A shows a current—voltage characteristic exhibited when the rectangular wave of 1 kHz shown in FIG. 6B is applied as AC bias. The bias current values +Ib and −Ib produce respective phases inverted relative to each other, with respect to the same modulation field. As a result, the output voltage waveforms have respective phases inverted relative to each other with respect to the same modulation field $\Phi$.

Figure 6C:
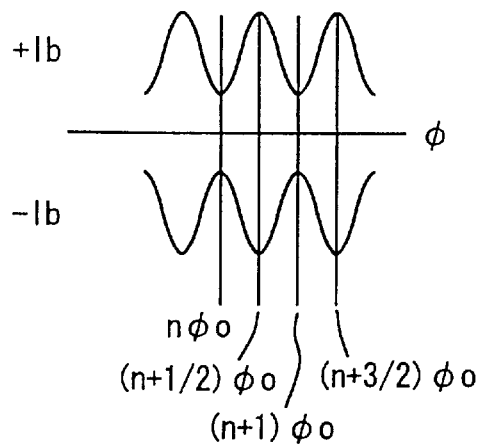
Figure 7:
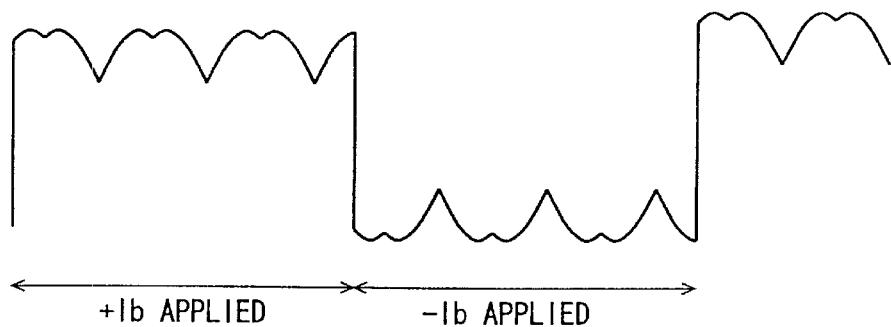
FIG. 7 illustrates a characteristic of change in voltage with time.

FIG. 7 shows the states in FIGS. 6A to 6C by using a curve showing voltage change with time that is employed for optimization of bias current Ib as shown in FIG. 2C. Referring to FIG. 7, the time periods in which +Ib and −Ib are applied respectively are illustrated.

After bias current Ib is adjusted as described above, a feedback loop is made ON to effect a flux locked state (feedback ON/OFF switch 27 is turned on).

Figure 8:
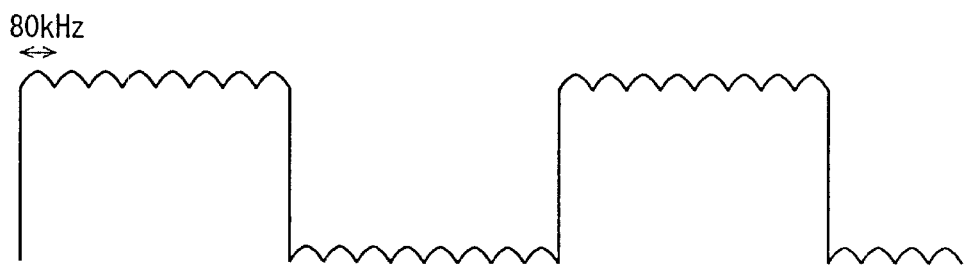

In the time periods in which bias currents +Ib and −Ib are applied respectively, the phases do not match and there is generated an unstable state. The circuit operates in this case to output a waveform which achieves a normal feedback status as shown in FIG. 8. FIG. 8 shows change of the output voltage with respect to time.

Figure 9:
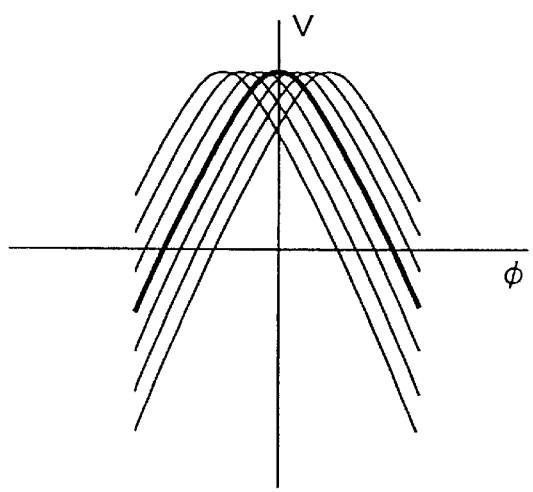
FIG. 9 shows the state of FIG. 8 on a voltage monitor.

Actually, this status is displayed as shown in FIG. 9 on voltage monitor 15 in FIG. 1. Specifically, orderly curved waveforms in phase with each other appear to be arranged shifted from each other. A frequency component of 80 kHz which is twice the modulation frequency is to be output in this way.

Figure 10A:
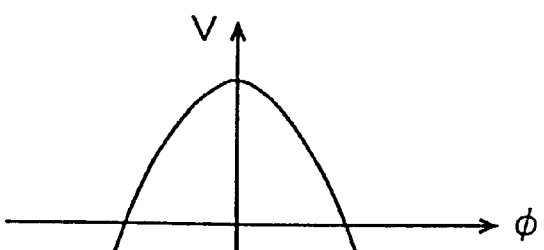
FIGS. 10A and 10B illustrate a magnetic field—voltage characteristic after adjustment.
Figure 10B:
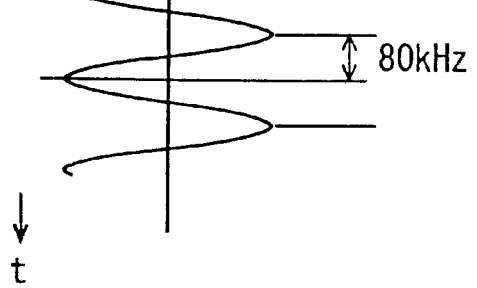

Modulation field offsets having the same absolute value and different polarities are applied depending on the polarities of current bias. By changing the absolute value, respective phases of output voltages when the current biases are + and − respectively change by the same phase amount in a direction to allow phases to match with each other. (Although the phases could seemingly separate from each other, they match every 360°.) Consequently, the voltages are in phase with each other at a certain point as shown in FIGS. 10A and 10B. FIG. 10A illustrates a modulation field—voltage characteristic and FIG. 10B illustrates change of the modulation field with respect to time.

As shown in FIGS. 10A and 10B, the output signal has only the component of 80 kHz. Optimization of the magnetic field bias is thus achieved by maximizing the frequency component which is twice the modulation frequency. Accordingly, the sum of modulation field frequency component and component twice the modulation field frequency is maximized to optimize current bias Ib, and then feedback is performed. The magnetic field bias is optimized by making adjustment such that the sum of modulation field frequency component and component twice the modulation field frequency is the maximum. Finally, re-lock (feedback) is done.

Figure 11:
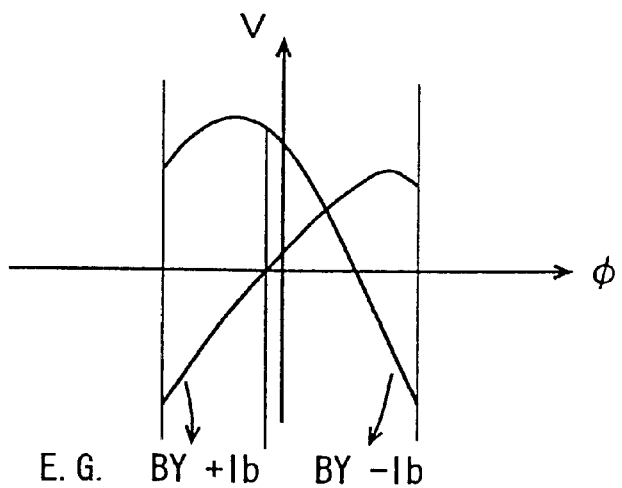
FIG. 11 shows a display status on the voltage monitor in manual mode.
Figure 12:
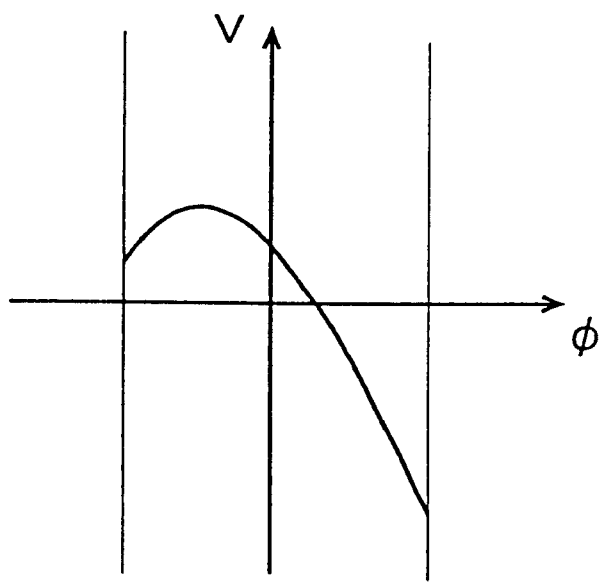
FIG. 12 shows magnetic a field—voltage characteristic on the voltage monitor in the manual mode.
Figure 13:
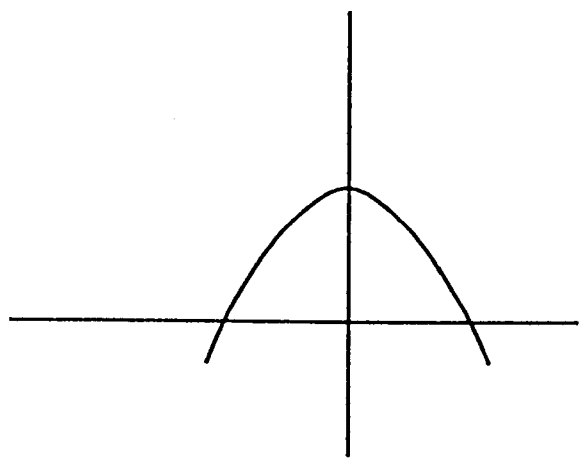
FIG. 13 illustrates a magnetic field—voltage characteristic after adjustment.

It is noted that the magnetic field bias is adjusted in manual mode by matching phases for +Ib and −Ib respectively and then performing feedback. For example, current bias Ib is adjusted on voltage monitor 15 such as an oscilloscope, then the phases as shown in FIG. 11 are adjusted by magnetic field bias as shown in FIG. 12, and the following feedback provides the operating state as shown in FIG. 13.

Second Embodiment

Figure 14:
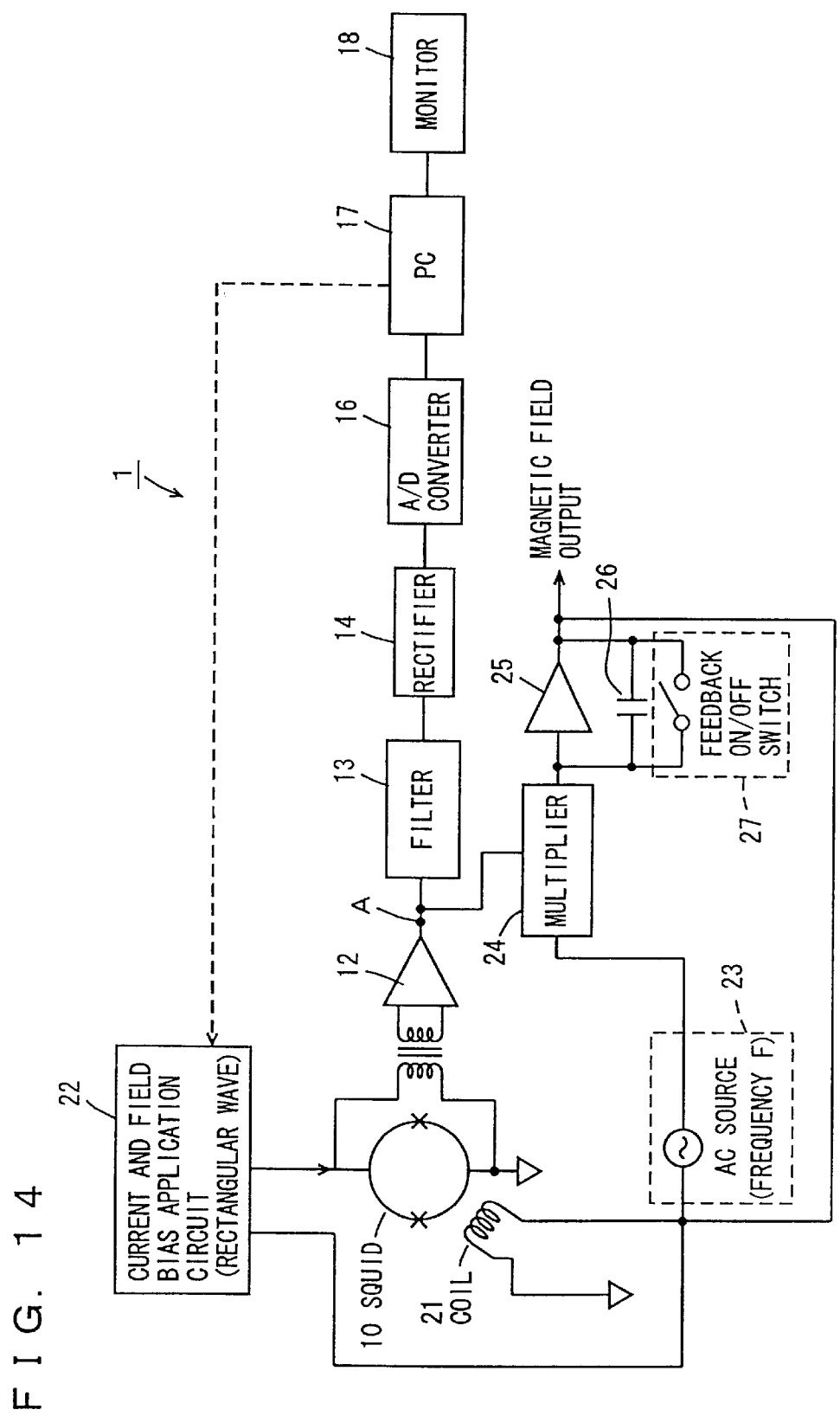
FIG. 14 is E block diagram showing an entire structure of a SQUID modulation drive circuit in a second embodiment.
Figure 15:
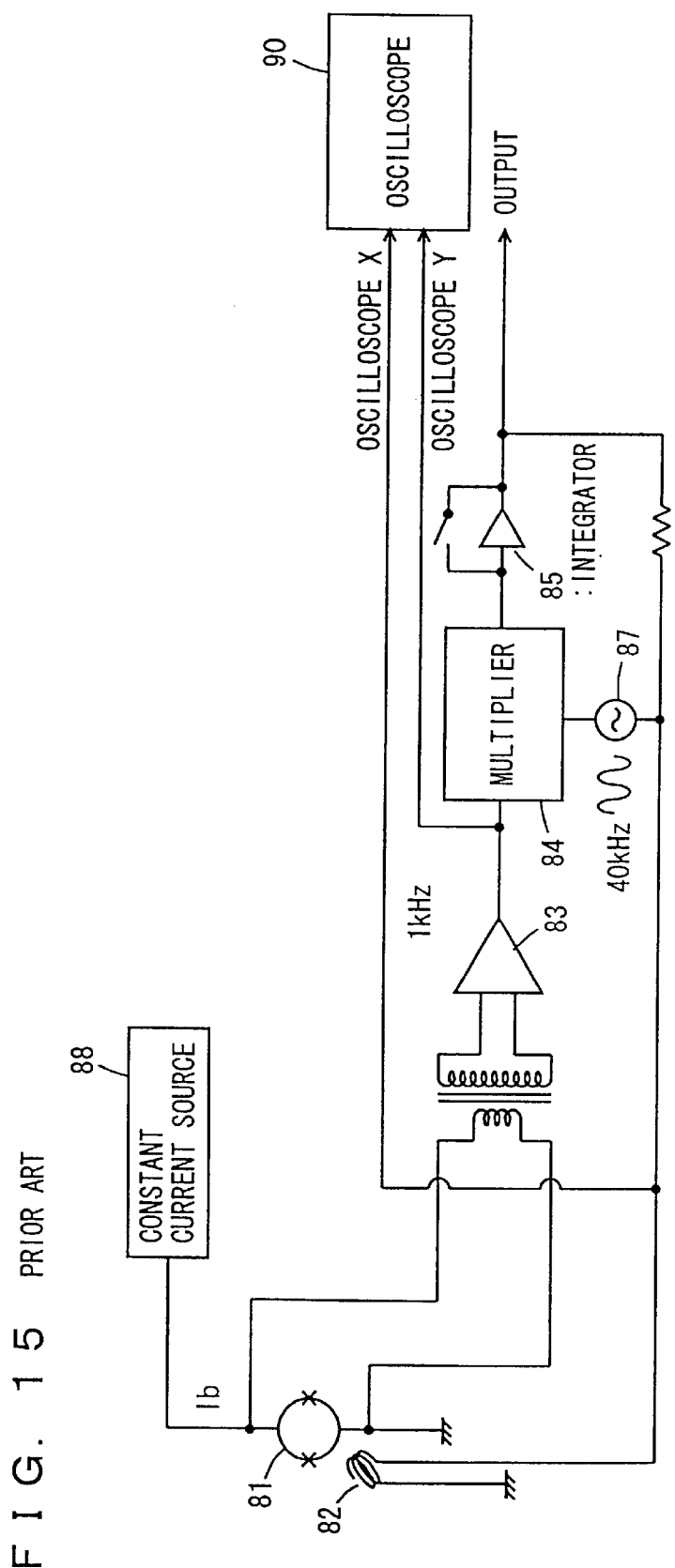
FIG. 15 is a block diagram showing a SQUID modulation drive circuit using a conventional FLL.

The second embodiment is now described. FIG. 14 is a circuit diagram in the second embodiment that corresponds to FIG. 1. Referring to FIG. 14, magnetic field bias is automatically adjusted by using a personal computer 17 in the second embodiment. Specifically, a rectified analog signal is transformed to a digital signal by an A/D converter 16, and the digital signal is input to personal computer 17 to automatically control the magnetic field bias via a current and field bias application circuit 22. Other components and operations are identical to those of the first embodiment, and the identical components are represented accordingly by the same reference characters and description thereof is not repeated here.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of adjusting magnetic field bias in a modulation drive circuit for a SQUID, comprising the steps of:
    applying an AC bias modulation signal at a predetermined first frequency to a flux located loop maintaining magnetic flux supplied to said SQUID at a constant value;
    applying an alternating current of a rectangular wave having a predetermined second frequency to a coil adjacent to said SQUID to adjust the magnetic field bias;
    picking out an output voltage from said SQUID to which said AC bias modulation signal at the predetermined first frequency and said alternating current of the rectangular wave having the predetermined second frequency are applied; and
    picking out said output voltage such that a frequency component of the voltage which is twice as high as said first frequency is a maximum frequency.

2. The magnetic field bias adjusting method according to claim 1, wherein
    said step of applying the modulation signal at the predetermined first frequency to said flux locked loop includes the step of applying said modulation signal at the predetermined first frequency to a coil adjacent to said SQUID, and
    said magnetic field bias is adjusted by applying magnetic field bias to said coil adjacent to said SQUID.

3. The magnetic field bias adjusting method according to claim 2, wherein said magnetic field bias is manually adjusted.

4. The magnetic field bias adjusting method according to claim 2, wherein said magnetic field bias is automatically adjusted.

5. The magnetic field bias adjusting method according to claim 2, wherein said bias current is alternating current.

6. The magnetic field bias adjusting method according to claim 2, wherein
    said bias current is direct current.

7. A device for adjusting magnetic field bias in a modulation drive circuit for a SQUID, comprising:
    means for applying an AC bias modulation signal at a predetermined first frequency to a flux locked loop maintaining magnetic flux supplied to said SQUID at a constant value;
    means for applying an alternating current of a rectangular wave having a predetermined second frequency to a coil adjacent to said SQUID to adjust the magnetic field bias;
    means for picking out an output voltage from said SQUID to which said AC bias modulation signal at the predetermined first frequency and said alternating current of the rectangular wave having the predetermined second frequency are applied; and
    a filter for picking out said output voltage such that a frequency component of the voltage which is twice as high as said first frequency is a maximum frequency component.

8. The magnetic field bias adjusting device according to claim 7, further comprising a coil adjacent to said SQUID, wherein
    said means for applying the modulation signal at the predetermined first frequency applies said modulation signal at the predetermined first frequency to said coil, and said magnetic field bias is adjusted by applying magnetic field bias to said coil.

9. The magnetic field bias adjusting device according to claim 8, wherein said magnetic field bias is manually adjusted.

10. The magnetic field bias adjusting device according to claim 8, wherein said magnetic field bias is automatically adjusted.

11. The magnetic field bias adjusting device according to claim 8, wherein said bias current is alternating current.

12. The magnetic field bias adjusting device according to claim 8, wherein said bias current is direct current.

* * * * *